US010523232B1

(12) United States Patent
Weikert

(10) Patent No.: US 10,523,232 B1
(45) Date of Patent: Dec. 31, 2019

(54) SYSTEM AND METHOD FOR CONVERTING A DIGITAL INPUT SIGNAL INTO AN ANALOG OUTPUT SIGNAL

(71) Applicant: Rohde & Schwarz GmbH & Co. KG, Munich (DE)

(72) Inventor: Oomke Weikert, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/111,940

(22) Filed: Aug. 24, 2018

(51) Int. Cl.
*H03M 1/66* (2006.01)
*H04L 1/00* (2006.01)
*H04B 1/00* (2006.01)

(52) U.S. Cl.
CPC ............ *H03M 1/66* (2013.01); *H04B 1/0017* (2013.01); *H04L 1/0071* (2013.01)

(58) Field of Classification Search
CPC ....... H03M 1/66; H04B 1/0017; H04L 1/0071
USPC .................................. 341/144; 375/241, 240
See application file for complete search history.

(56) References Cited

U.S. PATENT DOCUMENTS

| 6,151,354 A * | 11/2000 | Abbey .................... H04B 1/406 375/211 |
| 6,173,190 B1 * | 1/2001 | Usui ........................ H01Q 3/02 455/103 |
| 2005/0001684 A1 * | 1/2005 | Braithwaite .......... H03F 1/3247 330/263 |
| 2005/0085201 A1 * | 4/2005 | Martin .................... H04B 1/005 455/168.1 |
| 2005/0094714 A1 * | 5/2005 | Robinson ............. H04B 1/0483 375/148 |
| 2009/0052556 A1 | 2/2009 | Fernandez |
| 2011/0244917 A1 * | 10/2011 | Chiou .................. H04B 1/0057 455/550.1 |
| 2016/0308551 A1 * | 10/2016 | Talty ..................... H04L 1/0071 |
| 2016/0315648 A1 * | 10/2016 | Talty ........................ H04B 1/04 |
| 2018/0217189 A1 * | 8/2018 | Feldhaus ................ G01R 23/16 |

* cited by examiner

*Primary Examiner* — Lam T Mai
(74) *Attorney, Agent, or Firm* — Christensen O'Connor Johnson Kindness PLLC

(57) ABSTRACT

A system for converting a digital input signal into an analog output signal is provided, the system has at least three different signal paths with different but overlapping frequency ranges, at least three digital-to-analog converters, at least three analog filters, and a combiner unit. Each of the digital-to-analog converters is connected to at least one signal path, wherein the signals transmitted to the digital-to-analog converters are phase coherent. Each of the digital-to-analog converters is connected to a combiner unit, and each of the analog filters is associated with one of the digital-to-analog converters, wherein at least one of the digital-to-analog converters has a lower sampling rate than the sampling rate of at least two others of the digital-to-analog converters. Further, a method for converting a digital input signal into an analog output signal is shown.

20 Claims, 6 Drawing Sheets

SYSTEM AND METHOD FOR CONVERTING A DIGITAL INPUT SIGNAL INTO AN ANALOG OUTPUT SIGNAL

FIELD OF THE DISCLOSURE

Embodiments of the present disclosure relate generally to a system for converting a digital input signal into an analog output signal as well as a method for converting a digital input signal into an analog output signal.

BACKGROUND

Digital-to-analog converters (DAC) have a limited bandwidth. However, a bandwidth of 8 GHz and higher for converting digital signals into analog signals is desired.

Known methods to achieve a high bandwidth for digital-to-analog conversion are time interleaving and bandwidth interleaving of DAC.

However, with time interleaving, very precise high frequency switches are necessary on the analog side, which are complex and cost-intensive.

With the bandwidth interleaving, on the analog side, i.e. after the DAC, analog band mixers are necessary, which have non-linearities and thus deteriorate the output signal.

SUMMARY

Thus, there is a need for a simple, cost-efficient and high quality system and method for converting a digital signal into an analog signal with a high bandwidth.

To address this need, or others, the present disclosure provides a system for converting a digital input signal into an analog output signal, comprising a signal input for the digital input signal, at least three different signal paths with different but overlapping frequency ranges, at least three digital-to-analog converters, at least three analog filters, a combiner unit and a signal output for the analog output signal. Each of the signal paths is connected to the signal input. Each of the digital-to-analog converters has a converter input being connected to at least one of the signal paths, wherein the signals transmitted to the converter inputs are phase coherent. Each of the digital-to-analog converters has a converter output being connected to a combiner input of the combiner unit. Each of the analog filters is associated with one of the converter outputs and the combiner unit is connected to the signal output. At least one of the digital-to-analog converters has a lower sampling rate than the sampling rate of at least two others of the digital-to-analog converters.

Each digital-to-analog converter may be connected to more than one signal path. Further, no mixer is provided on the analog side, e.g., between the digital-to-analog converters and the signal output.

For this purpose or others, a method for converting a digital input signal into an analog output signal is further provided, comprising the following steps:

providing the digital input signal;

dividing the digital input signal into at least three partial signals in signal paths with different but overlapping frequency ranges;

providing at least one digital-to-analog converter associated with each of the signal paths, wherein at least one of the digital-to-analog converters has a lower sampling rate than the sampling rate of at least two others of the digital-to-analog converters;

transmitting each of the partial signals to the respective one of the associated digital-to-analog converters, wherein the partial signals transmitted to the digital-to-analog converters are phase coherent;

converting the partial signals into converted partial signals using the associated digital-to-analog converters;

filtering the converted partial signals; and combining all of the converted partial signals using a combiner unit yielding the analog output signal.

With this system and method, only low-pass filters and band-pass filters on the analog side are necessary, e.g., there is no need for a mixer on the analog side that could deteriorate the analog system.

Further, there is no need for a very precise high frequency switch.

Thus, the disclosed subject matter and the following claims provide a simple, cost-efficient system and method for converting a digital input signal into an analog output signal with a high bandwidth at a very high quality.

For example, the lower sampling rate is about ⅔ of the sampling rate of the at least two others of the digital-to-analog converters, to improve the conversion.

In an embodiment, the analog filters are provided in the combiner unit and/or in the analog-to-digital converters achieving a compact design of the system. In some embodiments, the analog filters may be located subsequent to the combiner input or precedent to the converter output. In order to reduce complexity of the system in some embodiments, the analog filters are low-pass filters and/or band-pass filters.

For simple blending of the partial signals, the combiner unit in some embodiments comprise at least one analog combiner.

In an embodiment of the disclosure, at least two digital filters are provided for dividing the digital input signal received at the signal input.

In some embodiments, the at least two digital filters are provided in different ones of the signal paths in order, for example, to achieve a reliable division of the digital input signal.

In some embodiments, the at least two digital filters may be overlap low-pass filters to reduce costs of the filters.

For example, the at least two digital filters have the same number of filter coefficients so that the signal paths have the same time delay. The number of filter coefficients may be odd in order to achieve an integer group delay of the partial signals.

To achieve the broad bandwidth reliably, the digital-to-analog converters have different frequency ranges, wherein the frequency range of the digital-to-analog converter with the lower sampling rate lies between the frequency range of the at least two other digital-to-analog converters.

In an embodiment, at least two of the digital-to-analog converters operate in the same Nyquist zone to simplify the system.

Additionally or alternatively at least two of the digital-to-analog converters operate in different Nyquist zones to achieve a broad output bandwidth.

In order to create partial signals of the digital input signal with different frequency ranges, at least two of the at least three signal paths comprise a first mixer with a first local oscillator, a digital filter and/or a delay module.

For example, the delay module may be subsequent to the digital filter. Further, the digital filter may be subsequent to the first mixer.

In an embodiment, at least one other of the at least three signal paths comprises a first mixer with a first local oscillator, a digital filter and/or a resampler to create a resampled signal in a specific, for example, intermediate frequency range.

In this case, the signal paths may be parallel and not linked to each other.

For example, the digital filter may be subsequent to the first mixer and the resampler may be subsequent to the digital filter.

In another embodiment, at least one other of the at least three signal paths comprises a delay module, a first mixer and/or a resampler providing a less complex system.

In other embodiments, the at least three signal paths comprise a first signal path, a second signal path and a third signal path. The first signal path and the third signal path each comprise, for example, a first mixer with a first oscillator, respectively, a subsequent digital filter and a side path connected to a connection point of the second signal path. A side mixer with a side local oscillator is provided, for example, in each of the side paths of the first signal path and the third signal path, the side mixers being configured to have the opposite effect of the first mixers of the first and third signal path, respectively. The connection point is located, for example, in the second signal path at a position, for example, subsequent to a delay module of the second signal path and precedent to a first mixer of the second signal path. This way, a digital filter in the second signal path is not necessary.

For example, the partial signals of the side paths of the first signal path and the third signal path are subtracted from the partial signal of the second signal path at the connection point.

In order to improve signal quality in some embodiments, each of the at least three signal paths comprises, for example, an equalizer and/or a second mixer with a second local oscillator precedent to the digital-to-analog converters.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
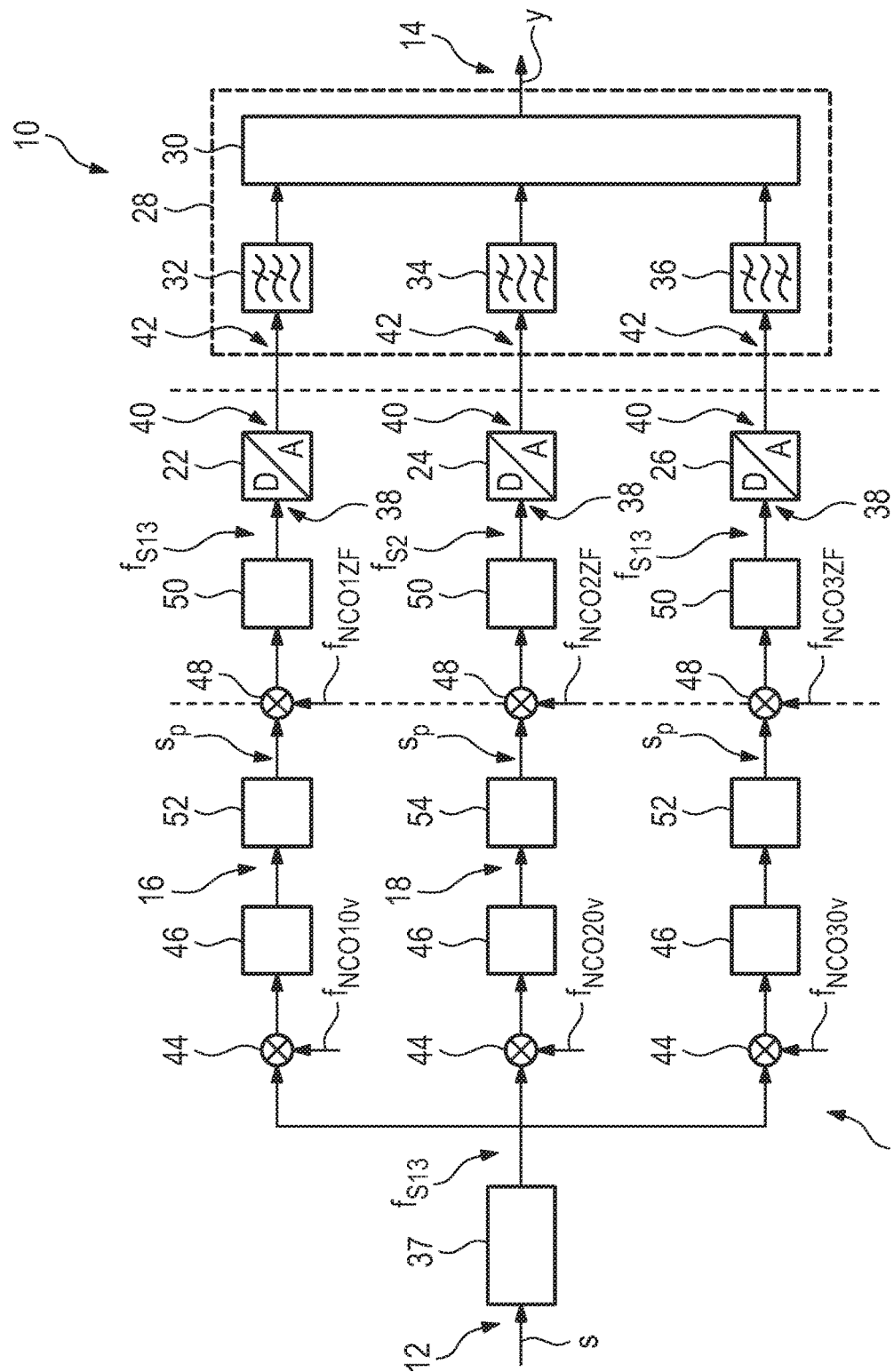
FIG. 1 shows schematically a first embodiment of a system according to the disclosure.
Figure 7:
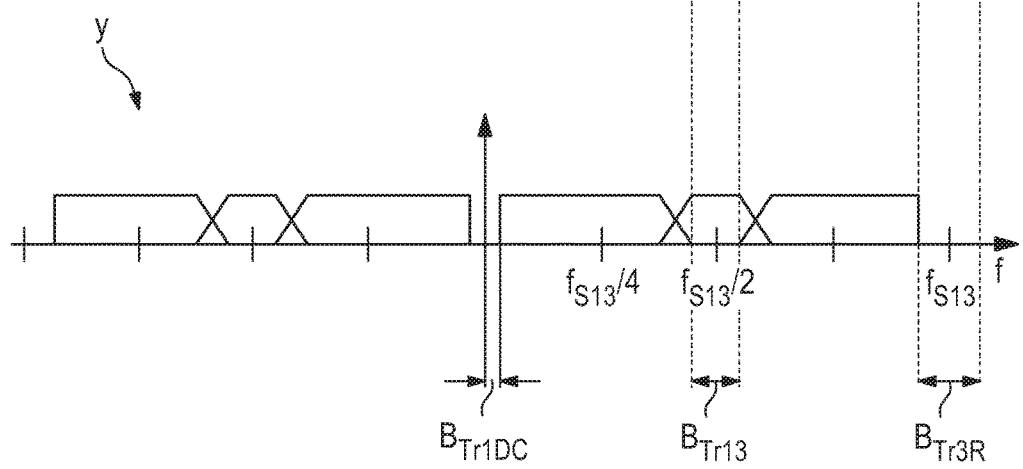
FIG. 7 shows the analog output signal of the system according to FIG. 1 in response to the input signal shown in FIG. 2.

FIG. 1 shows schematically a system 10 for converting a digital input signal s (FIG. 2) into an analog output signal y (FIG. 7). The system 10 may be part of, for example, a digital-to-analog converter unit with a broad bandwidth.

As shown in the embodiment of FIG. 1, the system 10 comprises a signal input 12, a signal output 14, a first signal path 16, a second signal path 18 and a third signal path 20, all of which are arranged between the signal input 12 and the signal output 14, a first digital-to-analog converter 22 (DAC), a second digital-to-analog converter 24 and a third digital-to-analog converter 26. Each of the DAC 22, 24, 26 has a frequency range, a sampling rate, and a converter input 38 as well as a converter output 40.

In some embodiments, the system 10 further comprises a combiner unit 28 with an analog combiner 30 and, in the shown embodiment, a first analog filter 32, a second analog filter 34 and a third analog filter 36.

The three signal paths 16, 18, 20 are connected to the signal input 12. In the shown embodiment, the signal input 12 comprises a resampler 37 that is configured to resample the digital input signal s, which may have an original sampling rate $f_{SC}$, with the sampling rate $f_{S13}$.

In a first embodiment the three signal paths 16, 18, 20, which are on the digital side of the system 10, i.e. precedent to the digital-to-analog converters 22, 24, 26, have the same underlying structure. In the shown embodiment, the signal paths 16, 18, 20 are parallel and not linked to each other.

From the signal input 12 to the signal output 14, each of the signal paths 16, 18, 20 comprises, for example, a first mixer 44 with a first local oscillator, then a digital filter 46, then a second mixer 48 with a second local oscillator and finally an equalizer 50. The first signal path 16 and the third signal path 20 each comprise, for example, a delay module 52 between the digital filter 46 and the second mixer 48. At this position, the second signal path 18 comprises, for example, a resampler 54. The resampler 54 has the sampling rate $f_{S2}$ in the shown embodiment.

Thus, in some embodiments, the three signal paths 16, 18, 20 comprise three digital filters 46 in total, wherein the digital filters 46 are overlap low-pass filters. The digital filters 46 of the different signal paths 16, 18, 20 all have the same number of filter coefficients, for example, an odd number of filter coefficients.

The equalizer 50 of each of the signal paths 16, 18, 20 is then connected to the converter input 38 of the respective DAC 22, 24, 26. For example, the converter input 38 of the first DAC 22 is connected to the first signal path 16, the converter input 38 of the second DAC 24 is connected to the second signal path 18 and the converter input 38 of the third DAC 26 is connected to the third signal path 20. Thus, each DAC 22, 24, 26 is associated with one signal path 16, 18, 20 and receives the signals from the respective signal path 16, 18, 20. It is of course possible that the converter input 38 of any of the DAC 22, 24, 26 is connected to more than one signal path 16, 18, 20.

In some embodiments, the frequency ranges of the three digital-to-analog converters 22, 24, 26 differ from one another, however, the sampling rate of the first DAC 22 and the third DAC 26 are, for example, equal and called $f_{S13}$ in the following. The second DAC 24, however, has a lower sampling rate than the first and the third DAC 22, 26, referred to as $f_{S2}$ in the following. In the shown embodiment, the sampling rate $f_{S2}$ of the second DAC 24 is equal to ⅔ of the sampling rate $f_{S13}$ of the first and third DAC 22, 26.

The frequency ranges. i.e. bandwidths, of the DAC 22, 24, 26 overlap with one another, for example, the frequency range of the second DAC 24 overlaps with the frequency range of the first DAC 22 and the third DAC 26. The first DAC 22 has a bandwidth $B_{DAC1IndOV}$, the second DAC 24 has a bandwidth $B_{DAC2IndOV}$, and the third DAC 26 has a bandwidth $B_{DAC3IndOV}$ indicated in FIG. 2. The total bandwidth of the system is illustrated as $B_{total}$ in FIG. 2. Hence, the signal paths 16, 18, 20 have different and overlapping frequency ranges just like the DAC 22, 24, 26.

The combiner unit 28, for example, comprises three combiner inputs 42 that are connected to one of the DAC 22, 24, 26 each. In the shown embodiment, the analog filters 32, 34, 36 are associated with each one of the combiner inputs 42. For example, the converter outputs 40 of the first, second and third DAC 22, 24, 26 are connected to the first analog filter 32, the second analog filter 34 and the third analog filter 36, respectively, via the respective combiner input 42. Thus, each of the analog filters 32, 34, 36 is associated with at least one converter output 40. Of course, it is also possible that the analog filters 32, 34, 36 are provided in the DAC 22, 24, 26, meaning that each DAC 22, 24, 26 may comprise the respective analog filter 32, 34, 36. Either way, the analog filters 32, 34, 36 are associated with, for example, one of the converter outputs 40.

In some embodiments, the analog filters 32, 34, 36 have different but overlapping frequency ranges as well. Further, they may operate in different Nyquist zones. In the shown embodiment, the first analog filter 32 is a low-pass filter operating in the first Nyquist zone. The second analog filter 34 and the third analog filter 36 are band-pass filter with different passbands and both operate in the second Nyquist zone.

The analog filters 32, 34, 36 are connected to the analog combiner 30, which is configured to combine the signals of the analog filters 32, 34, 36 and provide the combined signal to the signal output 14. Thus, on the analog side of the system 10, i.e. subsequent to the digital to analog conversion by, for example, DACs 22, 24, 26, no mixer is provided or necessary.

Figure 2:
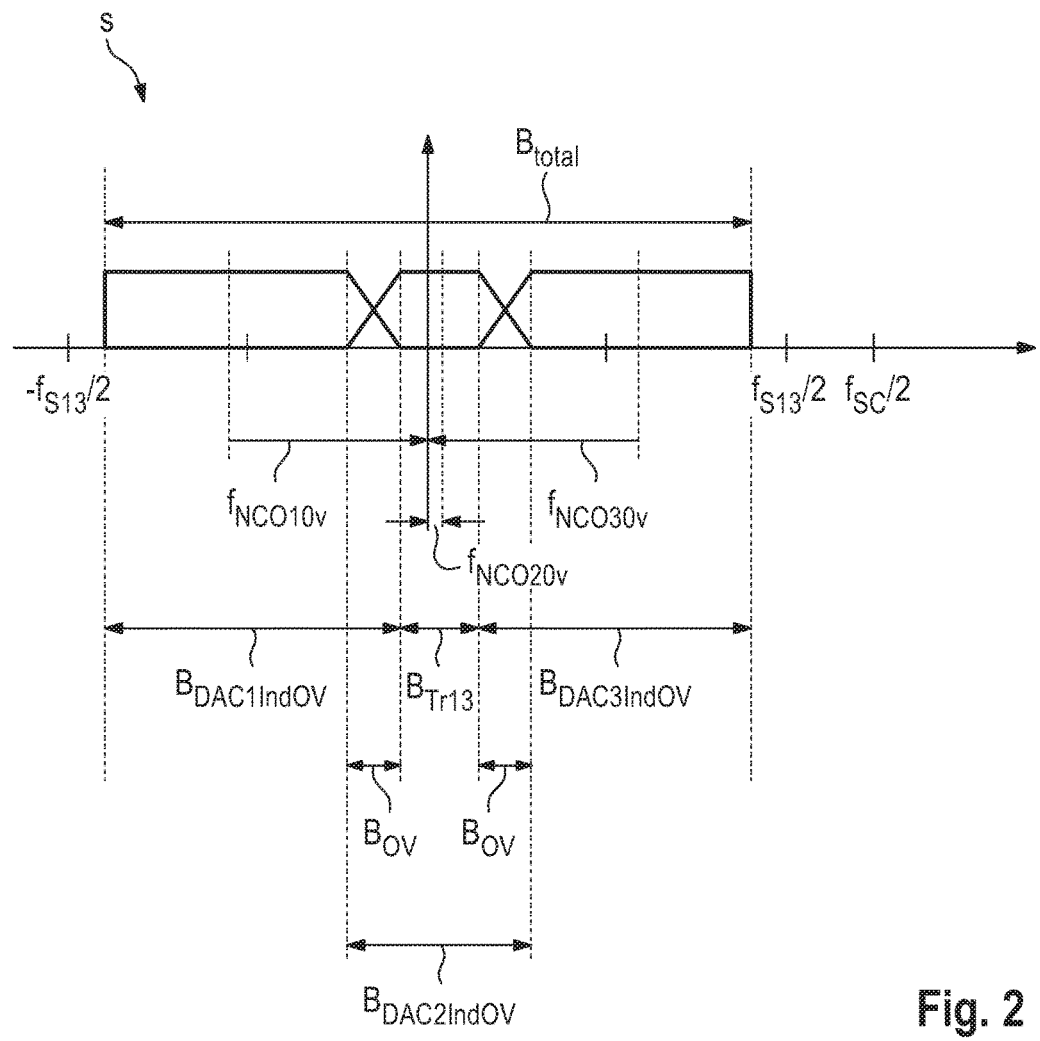
FIG. 2 shows an example of a digital input signal fed to the system according to FIG. 1.
Figure 3:
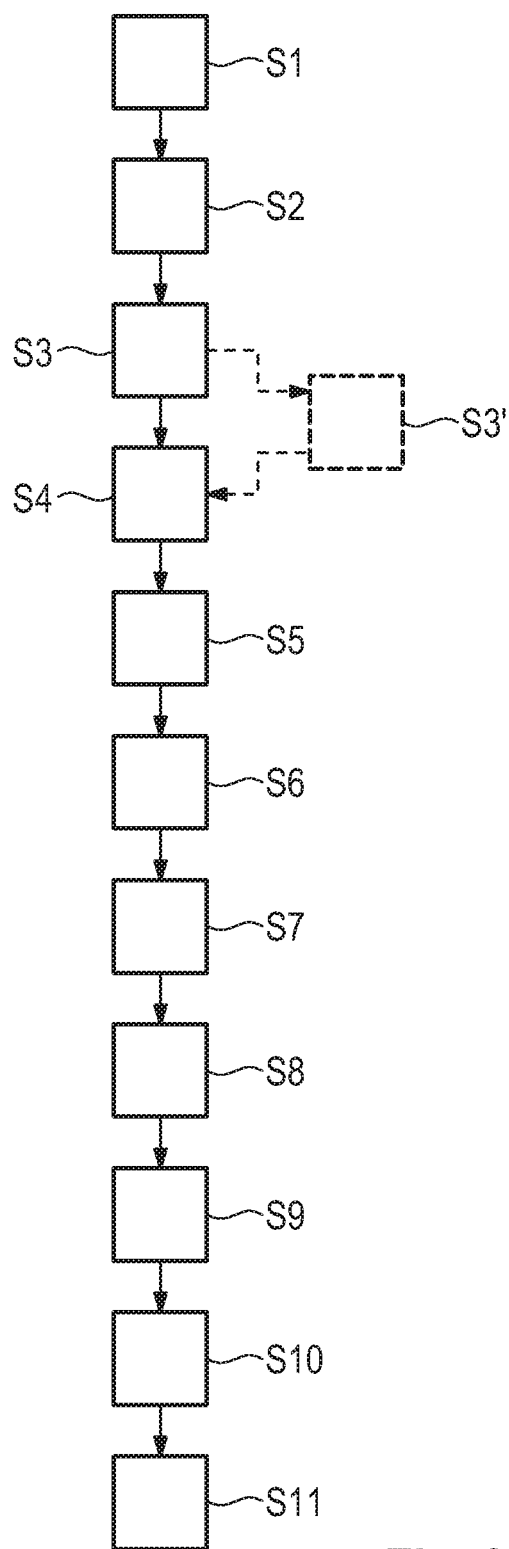
FIG. 3 shows a flow-chart of a method according to the disclosure.

The system 10 may be used to perform the representative method illustrated as a flow-chart in FIG. 3. In a first step S1, the digital input signal s, as shown in FIG. 2, is received by the signal input 12. In the second step S2, the received digital input signal s is resampled by the resampler 37 with the sampling rate $f_{S13}$.

In the subsequent step S3, the signal is fed into each of the signal paths 16, 18, 20, where it is divided by the digital filters 46 of each of the signal paths 16, 18, 20 into three partial signals $s_p$.

In conjunction with the first mixers 44, the digital filters 46 divide the input signal s into different partial signals of the signal path 16, 18, 20.

For this purpose, the local oscillators of the first mixers 44 of the signal paths 16, 18, 20 have different mixing frequencies, wherein the mixing frequency of the first mixer 44 of the first signal path 16 is denoted $f_{NCO10v}$, the frequency of the first mixer 44 of the second signal path 18 is denoted $f_{NCO20v}$, and the mixing frequency of the first mixer 44 of the third signal path 20 is denoted $f_{NCO30v}$.

FIG. 2 shows the three mixing frequencies of the signal paths 16, 18, 20 in relation to one another based on a representative digital input signal s that is received by the signal input 12. In each of the signal paths 16, 18, 20, the digital input signal s is firstly mixed with the mixing frequency of the respective signal path 16, 18, 20 in the first mixer 44 and then filtered by the digital filters 46 to create the partial signals $s_p$ in the different frequency ranges of the signal paths 16, 18, 20.

Figure 4A:
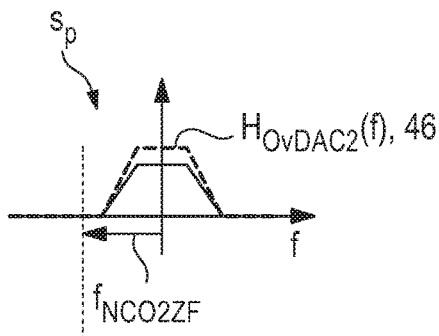
FIGS. 4a-4b show illustrations in the frequency domain of the partial signal in the first signal path of the system of FIG. 1 at two different positions.
Figure 5A:
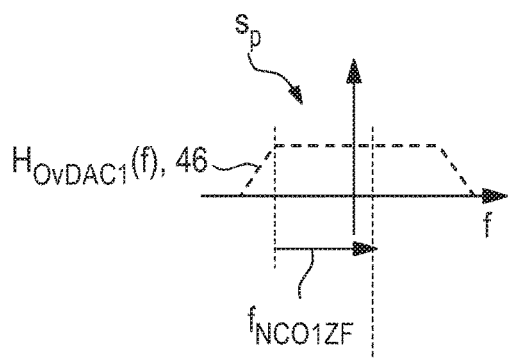
FIGS. 5a-5b show illustrations in the frequency domain of the partial signal in the second signal path of the system of FIG. 1 at the same positions as the partial signal shown in FIGS. 4a-4b.
Figure 6A:
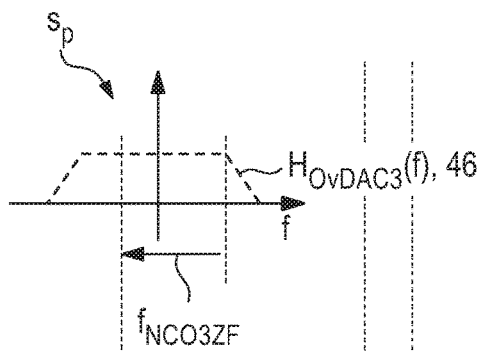
FIGS. 6a-6b show illustrations in the frequency domain of the partial signal in the third signal path of the system of FIG. 1 at the same positions as the partial signal shown in FIGS. 4a-4b.

The partial signals $s_p$ of the first signal path 16, of the second signal path 18 and of the third signal path 20 after the respective digital filter 46 are shown in FIGS. 4a, 5a and 6a, respectively.

In the subsequent step S4, the partial signal $s_p$ of the second signal path 18 is resampled by the resampler 54 with the second sampling rate $f_{S2}$ of the second DAC 24. Simultaneously, the partial signals $s_p$ of the first and third signal path 16, 20 are delayed in the delay modules 52 by the period of time that the resampler 54 in the second signal path 18 delays the respective partial signal $s_p$.

In the fifth step S5, the partial signals $s_p$ are then passed to the respective second mixer 48 of the respective signal path 16, 18, 20. With the second mixers 48 the partial signal $s_p$ are mixed up or down into the frequency range of the respective DAC 22, 24, 26. The mixing steps are already indicated in the FIGS. 4a, 5a and 6a. Thus, the mixing frequencies of the second mixers 48 of the signal path 16, 18, 20 are chosen with respect to the characteristics of the first DAC 22, the second DAC 24 and the third DAC 26, respectively.

The mixing frequency of the second mixer 48 of the first signal path 16 is denoted $f_{NCO1ZF}$, the mixing frequency of the second mixer 48 of the second signal path 18 is denoted $f_{NCO2ZF}$, and the mixing frequency of the second mixer 48 of the third signal path 20 is denoted $f_{NCO3ZF}$.

The partial signals $s_p$ then pass the equalizers 50 in step S6, before they are transmitted to the converter inputs 38 of the first, the second and the third DAC 22, 24, 26, respectively in step S7. The partial signals $s_p$ transmitted to the DAC 22, 24, 26 are, for example, phase coherent.

Figure 4B:
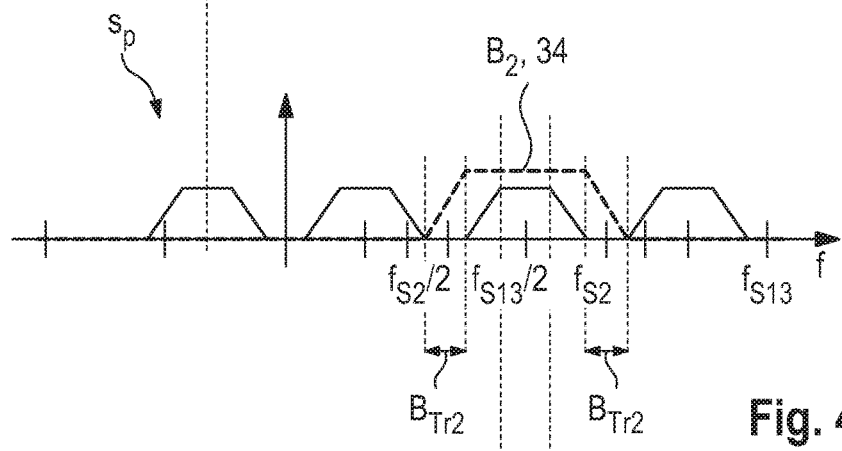
Figure 5B:
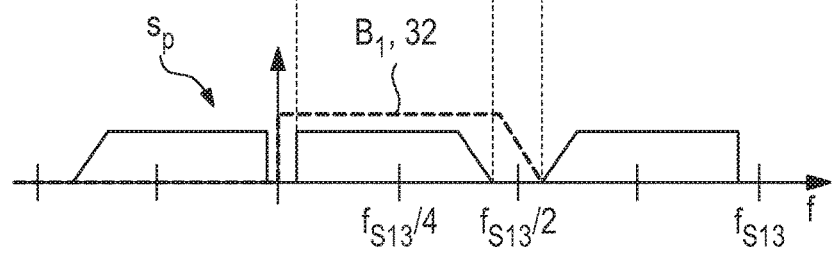
Figure 6B:
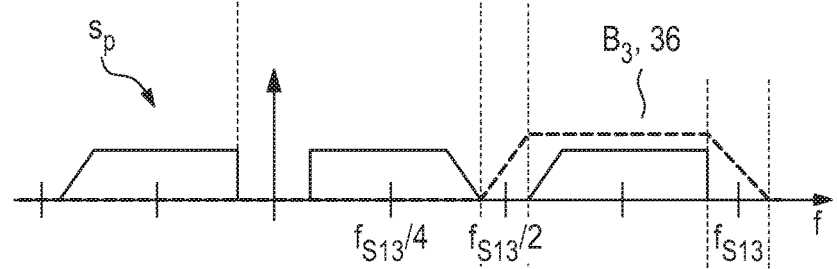

In step S8, the partial signals $s_p$ are then converted into analog converted partial signals $s_p$ by the respective DAC 22, 24, 26. The converted partial signals $s_p$ of the different signal paths 16, 18, 20 are shown in FIGS. 4b, 5b and 6b, respectively. In these FIGURES, the following analog filters 32, 34 and 36 are already indicated with the dashed lines.

From the converter outputs 40, the partial signals $s_p$ are transmitted to the combiner input 42, where they are filtered by the first analog filter 32, the second analog filter 34 and the third analog filter 36, respectively (step S9).

In some embodiments, the first analog filter 32 is a low-pass filter operating in the first Nyquist zone and has a passband $B_1$ (FIG. 4b). The second analog filter 34 is, for example, a band-pass filter and operates in, for example, the second Nyquist zone and has a passband $B_2$ (FIG. 5b), and the third analog filter 36 is also, for example, a band-pass filter operating in, for example, the second Nyquist zone having a passband $B_3$ as indicated in FIG. 6b.

In the shown embodiment, the filtering is performed after the combiner input 42. However, in an alternative embodiment, the filtering could also be done in the respective DAC 22, 24, 26 precedent to the converter outputs 40.

In the next step S10, the filtered and converted partial signals $s_p$ are then transmitted to the analog combiner 30 that combines the three partial signals $s_p$ to a single signal, which is the desired analog output signal y. The analog output signal y is illustrated in FIG. 7, in which the composition of the analog output signal y from the partial signals $s_p$ from FIGS. 4b, 5b and 6b is apparent. The analog output signal y is then passed to the signal output 14.

Thus, the system 10 is able to convert a digital input signal s with a bandwidth $B_{total}$ to an analog output signal y with the same bandwidth but without the need for broad bandwidth DAC 22, 24, 26 or analog mixers on the analog side of the DAC.

Mathematically, based in the digital input signal s(n) the complex signal $s_p(n)$ of the signal path p for the DAC p after the overlap first mixer 44 with the normalized frequency $f_{NCOOv}(P)$ and after the overlap low-pass digital filter 46 with the real coefficients $h_{Ov,LP}(p,l)$ with $l=0, 1, \ldots, N_{Ov}(p)-1$ is $$s_p(n) = (s(n) \cdot e^{j \cdot 2 \cdot \pi \cdot f_{NCOOv}(p) \cdot n + \Delta\varphi(p)}) * h_{Ov,LP}(p,l) \quad (1)$$

$$s_p(n) = \sum_{l=0}^{N_{Ov}(p)-1} s(n-l) \cdot e^{j \cdot 2 \cdot \pi \cdot f_{NCOOv}(p) \cdot (n-l) + \Delta\varphi(p)} \cdot h_{Ov,LP}(p,l).$$

In order to ensure that all digital filters 46 have the same group delay, the same number of filter coefficients is used for each digital filter, i.e.:

$$N_{Ov} = N_{Ov}(p) \forall p. \quad (2)$$

The number of filter coefficients is chosen to be an odd number so that the group delay $N_{Ov,gd}$ is even.

The sum signal y(n) of all paths is:

$$y(n) = \sum_{p=1}^{3} e^{-j \cdot 2 \cdot \pi \cdot f_{NCOOv}(p) \cdot n} \cdot s_p(n) \quad (3)$$

$$(n) = \sum_{p=1}^{3} e^{-j \cdot 2 \cdot \pi \cdot f_{NCOOv}(p) \cdot n} \sum_{l=0}^{N_{Ov}-1} s(n-l) \cdot$$

$$e^{j \cdot 2 \cdot \pi \cdot f_{NCOOv}(p) \cdot (n-l) + \Delta\varphi(p)} \cdot h_{Ov,L}$$

$$y(n) = \sum_{l=0}^{N_{Ov}-1} s(n-l) \cdot \underbrace{\sum_{p=1}^{3} e^{-j \cdot 2 \cdot \pi \cdot f_{NCOOv}(p) \cdot l + \Delta\varphi(p)} \cdot h_{Ov,LP}(p,l)}_{=h_{OvSum}}$$

$$y(n) = \sum_{l=0}^{N_{Ov}-1} s(n-l) \cdot h_{OvSum}(l)$$

$$y(n) = s(n) * h_{OvSum}(l).$$

The filter coefficients of the total filter are:

$$h_{OvSum}(l) = \quad (4)$$

$$\sum_{p=1}^{3} \underbrace{e^{-j \cdot 2 \cdot \pi \cdot f_{NCOOv}(p) \cdot l + \Delta\varphi(p)} \cdot h_{Ov,LP}(p,l)}_{=h_{Ov,BP}(p,l)} \text{ with } l = 0, 1, \ldots, N_{Ov}-1$$

with the substituted band-pass filters:

$$h_{Ov,BP}(p,l) = e^{-j \cdot 2 \cdot \pi \cdot f_{NCOOv}(p) \cdot l + \Delta\varphi(p)} \cdot h_{Ov,LP}(p,l). \quad (5)$$

This yields $$H_{Ov,BP}(p,k) = e^{+\Delta\varphi(p)} \cdot H_{Ov,LP}(k + f_{NCOOv}(p)). \quad (6)$$

The sum signal of all paths shall correspond to the digital input signal delayed by the group delay, i.e.

$$y(n) := s(n - N_{Ov,gd}). \quad (7)$$

This yields the following requirement for the total filter:

$$h_{OvSum}(l) \equiv \delta(n - N_{Ov,gd}) \quad (8)$$

Thus, the total filter shall comprise a frequency response with an absolute value of $$|H_{OvSum}(k)| \equiv 1 \text{ or } 0 \text{ dB} \quad (9)$$

and a linear phase with the slope $N_{Ov,gd}$:

$$\measuredangle (H_{OvSum}(k)) \equiv -2 \cdot \pi \cdot N_{Ov,gd} \cdot k. \quad (10)$$

The digital filters 46 are designed as symmetric filters 46 with real coefficients, yielding $$\measuredangle (H_{Ov,LP}(p,k)) = -2 \cdot \pi \cdot N_{Ov,gd} \cdot k. \quad (11)$$

With (6) follows that $$\measuredangle (H_{Ov,BP}(p,k)) = +\Delta\varphi(p) - 2 \cdot \pi \cdot N_{Ov,gd} \cdot (k + f_{NCOOv}(p)) \quad (12)$$

The phase condition of the total filter has to be satisfied by each of the substituted band-pass filters, i.e.

$$\measuredangle (H_{Ov,BP}(p,k)) = +\Delta\varphi(p) - 2 \cdot \pi \cdot N_{Ov,gd} \cdot (k + f_{NCOOv}(p)) \equiv -2 \cdot \pi \cdot N_{Ov,gd} \cdot k \quad (13)$$

Thus, the initial phase of the overlap (first) mixers 44 and/or first local oscillators in signal path p for the DAC p is $$\Delta\varphi(p) = +2 \cdot \pi \cdot N_{Ov,gd} \cdot f_{NCOOv}(p). \quad (14)$$

As a working example, the following parameters are provided:
1. The sampling rate $f_{S13}$ of the first DAC 22 and the third DAC 26 are 9 GHz;
2. The analog DC band of the first DAC 22 ($B_{Tr1DC}$) is 300 MHz, the analog transition band between the first DAC 22 and the third DAC 26 ($B_{Tr13}$) is 600 MHz, and the right analog transition band of the third DAC 26 ($B_{Tr3R}$) is 600 MHz;
3. The overlapping Range $B_{Ov}$ is 600 MHz, the sampling rate $f_{S2}$ of the second DAC 24 is 6 GHz and its analog transition ($B_{Tr2}$) is 1200 MHz;
4. For the first DAC 22 in the first Nyquist band, $f_{S13}/2$ is 4.5 GHz, $f_{S13}$ is 9 GHz, the left analog transition band (one-sided) is 300 MHz, the right analog transition band (one-sided) is 300 MHz, the ZF signal ranges from 0.3 to 4.2 GHz, the bandwidth ($B_{DAC1IndOv}$) including overlap is 3900 MHz, and the bandwidth without overlap is 3300 MHz;
5. For the second DAC 24 in the second Nyquist band, $f_{S2}/2$ is 3 GHz, $f_{S2}$ is 6 GHz, the left analog transition band (one-sided) is 600 MHz, the right analog transition band (one-sided) is 600 MHz, the ZF signal ranges from 3.6 to 5.4 GHz, the bandwidth including overlap ($B_{DAC2IndOv}$) is 1800 MHz, and the bandwidth without overlap is 600 MHz; and
6. For the third DAC 26 in the second Nyquist band, $f_{S13}/2$ is 4.5 GHz, $f_{S13}$ is 9 GHz, the left analog transition band (one-sided) is 300 MHz, the right analog transition band (one-sided) is 300 MHz, the ZF signal ranges from 4.8 to 8.7 GHz, the bandwidth ($B_{DAC3IndOv}$) including overlap ($B_{Ov}$) is 3900 MHz, and the bandwidth without overlap is 3300 MHz.

These parameters yield a usable bandwidth ($B_{total}$) of the system 10 of 8.4 GHz.

Figure 8:
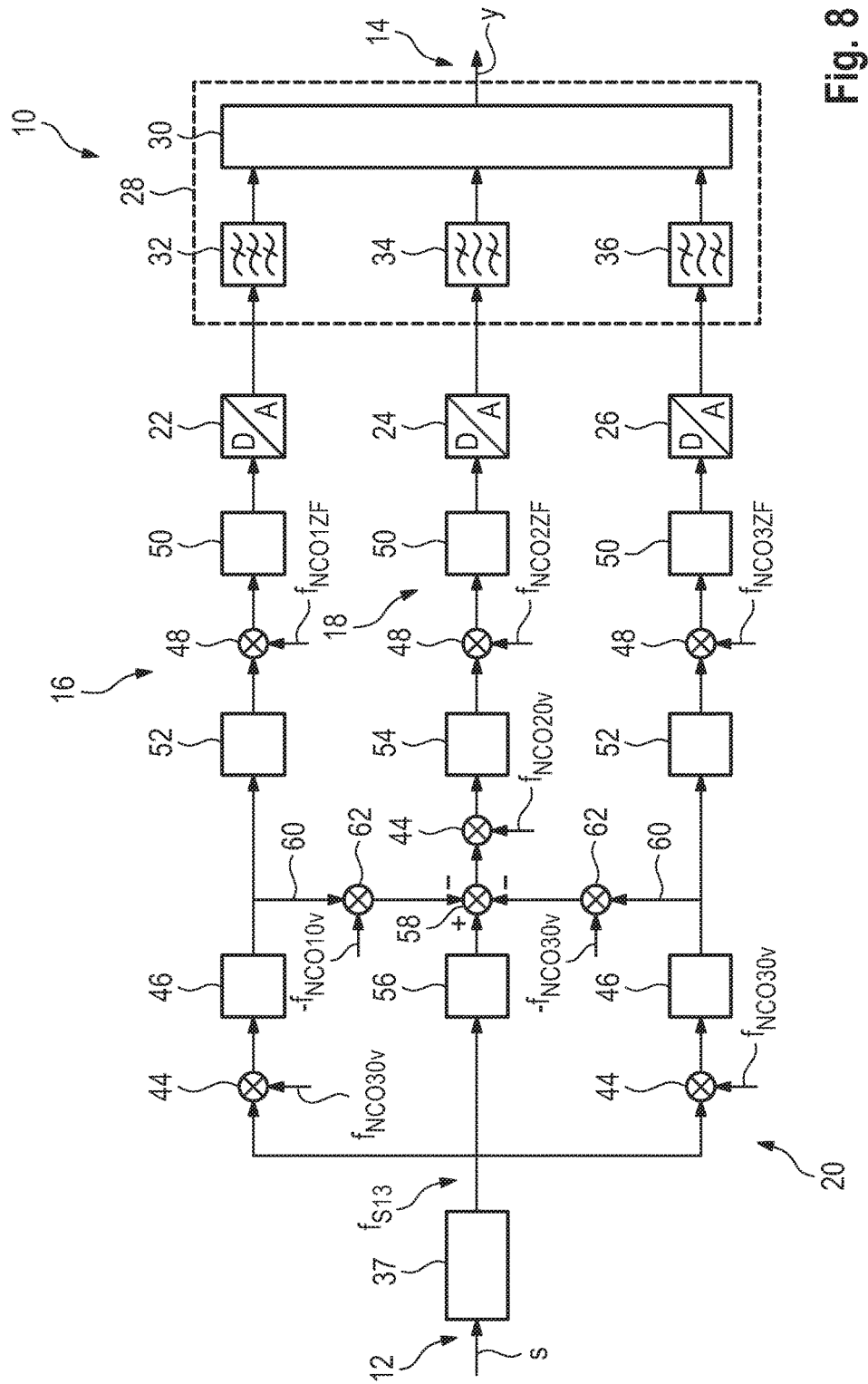
FIG. 8 shows a second embodiment of a system according to the disclosure schematically.

A second embodiment of the system 10 is shown in FIG. 8. The second embodiment of the system 10 is generally the same as the first embodiment shown in FIG. 1 so that only the differences are explained in the following. Same and functionally same parts are denoted with the same reference signs.

The system 10 of the second embodiment differs mainly in the second signal path 18. In this embodiment, the second signal path 18 comprises no digital filter 46. Instead, a delay module 56 is provided subsequent to the signal input 12 followed by a connection point 58. Subsequent to the connection point 58, the first mixer 44 of the second signal path 18 is provided and, after that, the resampler 54 follows just like in the first embodiment. The delay module 56 is configured to delay the partial signal $s_p$ of the second signal path 18 by the delay caused by the digital filters 46 in the first and third signal path 16, 20.

Further, in the system 10 according to the second embodiment, the first and third signal path 16, 20 each have a side path 60, which fork of the respective signal path 16, 20 after the digital filter 46. The side paths 60 each have a side mixer 62, configured to have the opposite effect on the partial signal $s_p$ than the respective first mixer 44 of the signal paths 16, 20. This is indicated by negative mixing frequencies $-f_{NCO10v}$ and $-f_{NCO30v}$, respectively. This means, that if the first mixer 44 mixes the signal up by a specific frequency f, the respective side mixer 62 mixes the signal down by the same frequency -f.

Both side paths 60 connect to the second signal path 18 at the connection point 58, where the signals of the side path 60 are subtracted from the partial signal $s_p$ of the second signal path 18. These additional steps are indicated in FIG. 3 as step S3'.

Apart from that, the method for converting the digital input signal s into the analog output signal y with the system 10 according to the second embodiment is the same as for the first embodiment.

Nevertheless, the system 10 according to the second embodiment provides a more effective approach, as one digital filter 46 can be omitted.

Mathematically, from (3) and (4) follows $$s(n - N_{Ov,gd}) = y(n) = \sum_{p=1}^{3} e^{-j \cdot 2\pi \cdot f_{NCOOv}(p) \cdot n} \cdot s_p(n). \quad (15)$$

Thus, the partial signal in the second signal path 18 at the second DAC 24 follows as:

$$s_2(n) = \\ e^{+j \cdot 2\pi \cdot f_{NCOOv}(2) \cdot n} \cdot \left[ s(n - N_{Ov,gd}) - \sum_{p=1,3} e^{-j \cdot 2\pi \cdot f_{NCOOv}(p) \cdot n} \cdot s_p(n) \right]. \quad (16)$$

Substituting $n=m+N_{Ov,gd}$ would create the causality of $s(n-N_{Ov,gd})$. In order to create the causality of $s_p(n)$ according to (1), the substitution $n=m+N_{Ov}-1$ is necessary.

Applying the substitution $n=m+N_{Ov}-1$ yields $$s_2(m+N_{Ov}-1) = e^{+j \cdot 2\pi \cdot f_{NCOOv}(2) \cdot (m+N_{Ov}-1)} \cdot [s(m+N_{Ov}-1-N_{Ov,gd}) - \Sigma_{p=1,3} e^{+j \cdot 2\pi \cdot f_{NCOOv}(2) \cdot (m+N_{Ov}-1)} \cdot s_p(m+N_{Ov}-1)]. \quad (17)$$

For the digital filters 46

$$2 \cdot N_{Ov,gd} = N_{Ov}(p) - 1 \quad (18)$$

applies. With (18) follows:

$$s_2(m+N_{Ov}-1) = e^{+j \cdot 2\pi \cdot f_{NCOOv}(2) \cdot (m+N_{Ov}-1)} \cdot \left[ s(m+N_{Ov,gd}) - \quad (19) \right.$$

-continued
$$\left. \sum_{p=1,3} e^{-j \cdot 2\pi \cdot f_{NCOOv}(p) \cdot (m+N_{Ov}-1)} \cdot s_p(m+N_{Ov}-1) \right].$$

In the numeric model, the steady initial values of $s_p(n)$ are stored beginning with $N_{Ov}-1$ so that $s_p(m+N_{Ov}-1)$ can be substituted by $s_p(m)$, yielding $$s_2(m) = e^{+j \cdot 2\pi \cdot f_{NCOOv}(2) \cdot (m+N_{Ov}-1)} \cdot \left[ s(m+N_{Ov,gd}) - \quad (20) \right.$$
$$\left. \sum_{p=1,3} e^{-j \cdot 2\pi \cdot f_{NCOOv}(p) \cdot (m+N_{Ov}-1)} \cdot s_p(m) \right].$$

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A system for converting a digital input signal into an analog output signal, comprising: a signal input for said digital input signal;
   at least three different signal paths with different but overlapping frequency ranges;
   at least three digital-to-analog converters;
   at least three analog filters;
   a combiner unit; and
   a signal output for said analog output signal, wherein:
   each of said signal paths being connected to said signal input;
   each of said digital-to-analog converters having a converter input being connected to at least one of said signal paths, wherein the signals transmitted to said converter inputs are phase coherent;
   each of said digital-to-analog converters having a converter output being connected to a combiner input of said combiner unit;
   each of said analog filters being associated with one of said converter outputs;
   said combiner unit being connected to said signal output; and
   at least one of said digital-to-analog converters has a lower sampling rate than the sampling rate of at least two others of said digital-to-analog converters.

2. The system according to claim 1, wherein said lower sampling rate is about ⅔ of said sampling rate of said at least two others of said digital-to-analog converters.

3. The system according to claim 1, wherein said analog filters are provided in at least one of said combiner unit and said analog to digital converters.

4. The system according to claim 1, wherein said analog filters are at least one of a low-pass filter and a band-pass filter.

5. The system according to claim 1, wherein said combiner unit comprises at least one analog combiner.

6. The system according to claim 1, wherein at least two digital filters are provided for dividing said digital input signal received at said signal input.

7. The system according to claim 6, wherein said at least two digital filters are provided in different ones of said signal paths.

8. The system according to claim 6, wherein said at least two digital filters are overlap low-pass filters.

9. The system according to claim 6, wherein said at least two digital filters have the same number of filter coefficients.

10. The system according to claim 1, wherein said digital-to-analog converters have different frequency ranges, wherein said frequency range of said digital-to-analog converter with said lower sampling rate lies between said frequency range of said at least two other digital-to-analog converters.

11. The system according to claim 1, wherein at least two of said digital-to-analog converters operate in the same Nyquist zone.

12. The system according to claim 1, wherein at least two of said digital-to-analog converters operate in different Nyquist zones.

13. The system according to claim 1, wherein at least two of said at least three signal paths comprise at least one of a first mixer with a first local oscillator, a digital filter and a delay module.

14. The system according to claim 13, wherein at least one other of said at least three signal paths comprises at least one of a first mixer with a first local oscillator, a digital filter and a resampler.

15. The system according to claim 13, wherein at least one other of said at least three signal paths comprises at least one of a delay module, a first mixer and a resampler.

16. The system according to claim 1, wherein said at least three signal paths comprise a first signal path, a second signal path and a third signal path,
wherein said first signal path and said third signal path each comprise a first mixer with a first oscillator, respectively, a subsequent digital filter and a side path connected to a connection point of said second signal path;
wherein a side mixer with a side local oscillator is provided in each of said side paths of said first signal path and said third signal path, said side mixers being configured to have the opposite effect of said first mixers of said first and third signal path, respectively; and
wherein said connection point is located in said second signal path at a position subsequent to a delay module of said second signal path and precedent to a first mixer of said second signal path.

17. The system according to claim 1, wherein each of said at least three signal paths comprises at least one of an equalizer and a second mixer with a second local oscillator precedent to said digital-to-analog converters.

18. A method for converting a digital input signal into an analog output signal, comprising the following steps:
a) providing said digital input signal;
b) dividing said digital input signal into at least three partial signals in signal paths with different but overlapping frequency ranges;
c) providing at least one digital-to-analog converter associated with each of said signal paths, wherein at least one of said digital-to-analog converters has a lower sampling rate than the sampling rate of at least two others of said digital-to-analog converters;
d) transmitting each of said partial signals to the respective one of said associated digital-to-analog converters, wherein said partial signals transmitted to said digital-to-analog converters are phase coherent;
e) converting said partial signals into converted partial signals using said associated digital-to-analog converters;
f) filtering said converted partial signals; and
g) combining all of said converted partial signals using a combiner unit yielding said analog output signal.

19. The method according to claim 18, wherein said digital input signal is divided by at least two digital filters.

20. The method according to claim 18, wherein at least two of said digital-to-analog converters operate in different Nyquist zones.

* * * * *